United States Patent
Christian et al.

(10) Patent No.: US 9,437,366 B2
(45) Date of Patent: Sep. 6, 2016

(54) METHOD FOR LASER ADJUSTABLE THIN FILM CAPACITORS

(71) Applicant: AVX Corporation, Fountain Inn, SC (US)

(72) Inventors: Kevin D. Christian, Myrtle Beach, SC (US); Gheorghe Korony, Myrtle Beach, SC (US)

(73) Assignee: AVX Corporation, Fountain Inn, SC (US)

( * ) Notice: Subject to any disclaimer, the term of this patent is extended or adjusted under 35 U.S.C. 154(b) by 310 days.

(21) Appl. No.: 14/230,312

(22) Filed: Mar. 31, 2014

(65) Prior Publication Data

US 2014/0208555 A1 Jul. 31, 2014

Related U.S. Application Data

(62) Division of application No. 13/089,421, filed on Apr. 19, 2011, now Pat. No. 8,689,417, which is a division of application No. 12/112,382, filed on Apr. 30, 2008, now Pat. No. 8,169,772.

(60) Provisional application No. 60/927,095, filed on May 1, 2007.

(51) Int. Cl.
| | |
|---|---|
| *H01G 7/00* | (2006.01) |
| *H01G 4/33* | (2006.01) |
| *H01G 4/38* | (2006.01) |
| *H01L 27/01* | (2006.01) |

(52) U.S. Cl.
CPC .................. *H01G 4/33* (2013.01); *H01G 4/38* (2013.01); *H01L 27/016* (2013.01); *Y10T 29/43* (2015.01); *Y10T 29/435* (2015.01)

(58) Field of Classification Search
CPC ........ H01G 4/33; H01G 4/38; H01L 27/016; Y10T 29/43; Y10T 29/435
See application file for complete search history.

(56) References Cited

U.S. PATENT DOCUMENTS

| | | |
|---|---|---|
| 3,117,365 A | 1/1964 | Belko, Jr. |
| 3,538,571 A | 11/1970 | Callahan et al. |
| 3,617,834 A | 11/1971 | Rayburn |
| 3,635,759 A | 1/1972 | Howatt |
| 4,217,570 A | 8/1980 | Holmes |
| 4,574,438 A | 3/1986 | Diepers et al. |
| 4,947,286 A | 8/1990 | Kaneko et al. |
| 5,159,300 A | 10/1992 | Nakamura et al. |

(Continued)

FOREIGN PATENT DOCUMENTS

JP 10055933 A 2/1998

*Primary Examiner* — Minh Trinh
(74) *Attorney, Agent, or Firm* — Dority & Manning, P.A.

(57) ABSTRACT

Disclosed are methodology for providing a precision laser adjustable (e.g., trimmable) thin film capacitor array. A plurality of individual capacitors are formed on a common substrate and connected together in parallel by way of fusible links. The individual capacitors are provided as laddered capacitance value capacitors such that a plurality of lower valued capacitors corresponding to the lower steps of the ladder, and lesser numbers of capacitors, including a single capacitor, for successive steps of the ladder, are provided. Precision capacitance values can be achieved by either of fusing or ablating selected of the fusible links so as to remove the selected subcomponents from the parallel connection. In-situ live-trimming of selected fusible links may be performed after placement of the capacitor array on a hosting printed circuit board.

7 Claims, 3 Drawing Sheets

(56) References Cited

U.S. PATENT DOCUMENTS

| | | |
|---|---|---|
| 5,367,430 A | 11/1994 | DeVoe et al. |
| 5,493,471 A | 2/1996 | Walther et al. |
| 5,548,474 A | 8/1996 | Chen et al. |
| 5,565,838 A | 10/1996 | Chan |
| 5,590,016 A | 12/1996 | Fujishiro et al. |
| 5,880,925 A | 3/1999 | DuPré et al. |
| 5,982,608 A | 11/1999 | Kalnitsky et al. |
| 6,198,619 B1 | 3/2001 | Fujioka |
| 6,243,253 B1 | 6/2001 | DuPre et al. |
| 6,294,827 B1 | 9/2001 | Iovdalsky et al. |
| 6,515,842 B1 | 2/2003 | Hayworth et al. |
| 6,549,396 B2 | 4/2003 | Brown |
| 6,577,491 B1 | 6/2003 | Ohtsuka et al. |
| 8,169,772 B2 * | 5/2012 | Christian ............ H01G 4/38 361/303 |
| 8,689,417 B2 * | 4/2014 | Christian ............ H01G 4/33 29/25.41 |
| 2002/0163769 A1 | 11/2002 | Brown |
| 2005/0105244 A1 | 5/2005 | Kern et al. |

* cited by examiner

METHOD FOR LASER ADJUSTABLE THIN FILM CAPACITORS

PRIORITY CLAIM

This application is a divisional of U.S. patent application Ser. No. 13/089,421 filed Apr. 19, 2011 and issued Apr. 8, 2014 as U.S. Pat. No. 8,689,417, which is a divisional of U.S. patent application Ser. No. 12/112,382 filed Apr. 30, 2008 and issued May 1, 2012 as U.S. Pat. No. 8,169,772, which claimed benefit of U.S. Provisional Patent Application No. 60/927,095 filed May 1, 2007, all entitled "PRECISION LASER ADJUSTABLE THIN FILM CAPACITORS", and all of which are incorporated herein by reference for all purposes. Any disclaimer that may have occurred during prosecution of the above-referenced application(s) is hereby expressly rescinded.

FIELD OF THE INVENTION

The present subject matter relates to apparatuses and methodologies for providing post production adjustable capacitors. More specifically, the present subject matter relates to thin film capacitors that are designed to be adjusted (such as by trimming) by the manufacturer or customer so as to provide precision capacitive values for incorporation such as into value critical circuitry.

BACKGROUND OF THE INVENTION

The use of discrete electrical components in modern day electronic devices remains an issue in many fields despite the advances in microelectonics and integrated circuit design. The necessity to provide discrete components may be driven by a number of factors. One such factor may be based on component electrical value while physical size considerations may also be of significance.

In the instance that a customer wishes to manufacture an electrical or electronic system or device requiring the use of capacitor components, such components may take on various roles and, consequently, may require widely varying physical and electrical properties. In some instances, large value capacitors with respect to either capacitive values and/or voltage handling capabilities may be of such physical size as to prohibit direct incorporation of the component into an electronic device. Such may especially be true in the instance of microelectronic or integrated circuit devices.

In other instances, while a particular subject capacitive component may be manufactured so as to be of a physical size sufficiently small to be incorporated into smaller electronic devices (including the aforementioned microelectronic and integrated circuit devices), there may be additional impediments to such incorporation. For example, one such reason may involve the need to vary the electrical values of the component in relation to the device or operating conditions with which or under which the component is employed.

High density mounting of electronic components on circuit boards is common in the electronics industry. Miniature ceramic capacitors having multiple layers have been used for some time in electronic devices such as cellular telephones, network routers, computers, and the like. The manufacturing techniques of such devices must be precise to provide for the greatly reduced size of such devices, while still affording desirable electrical operating characteristics.

Various United States Patents are directed to aspects of electronic component manufacturing. See, for example, U.S. Pat. No. 6,577,491 to Ohtsuka et al.; U.S. Pat. No. 6,515.842 to Hayworth, et al.; U.S. Pat. No. 6,243,253 and U.S. Pat. No. 5,880,925 to DuPre et al.; U.S. Pat. No. 5,590,016 to Fujishiro et al.; U.S. Pat. No. 5,565,838 to Chan; U.S. Pat. No. 5,548,474 to Chen at al.; U.S. Pat. No. 5,367,430 to DeVoe et al.; U.S. Pat. No. 5,159,300 to Nakamura et al.; U.S. Pat. No. 4,947,286 to Kaneko et al.; U.S. Pat. No. 4,574,438 to Diepers, et al.; U.S. Pat. No. 3,635,759 to Howatt; U.S. Pat. No. 3,617,834 to Rayburn; U.S. Pat. No. 3,538,571 to Callahan et al.; and U.S. Pat. No. 3,117,365 to Belko, Jr. The above referenced patents are for all purposes hereby incorporated by reference into this disclosure as if fully set forth herein.

For some time, the design of various electronic components has been driven by a general industry trend toward miniaturization. In such regard, a need generally exists for smaller electronic components having exceptional operating characteristics. For example, some applications require a large capacitance value, but are severely limited in the amount of space (often referenced as "real estate") such a capacitor may occupy on a circuit board.

Multi-layer ceramic devices, sometimes referred to as "multi-layer ceramic capacitors" or "MCC's," are often constructed with a plurality of alternating ceramic and electrode layers arranged in a stack. During manufacture, such layers may be pressed and formed into a vertically stacked structure. Such MLCC's may have a single capacitor on a chip, or may include several capacitors in an array. However, such capacitors typically have one pre-set capacitance value that cannot later be altered.

With the desire to increase functionality and reduce the size of such components, manufacturers are looking for new ways to provide varying (i.e., multiple) capacitance values in microcircuits. However, as the size of capacitors decreases, the dead space or spacing that must exist between capacitors when mounted on a circuit board becomes relatively more important as a limiting factor in miniaturizing a design.

More recently, manufacturers have sought ways to reduce the size of capacitor arrays while simultaneously also increasing the flexibility of such capacitor arrays. In the context of the present disclosure, the term capacitor array is meant to describe a unit comprised of multiple capacitors. A significant limitation of current designs is that many currently known arrayed capacitors, once installed and constructed in the chip, are not variable as to its value (i.e., the degree to which it can hold a charge).

A capacitor array having capacitors of various values within a single chip would be highly desirable. Thus, a capacitor array design providing board manufacturers and assemblers more flexibility by affording multiple capacitance values on a single chip would be desirable.

While various implementations of multiple capacitance devices and capacitor array devices have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved thin-film capacitor structure has been provided. More particularly, a precision laser adjustable (for example, trimmable) thin film capacitor structure has been provided wherein the capacitance value may be readily adjusted after manufacture.

In an exemplary configuration, an adjustable, thin film capacitor structure is provided with a base value capacitor and plural parallel coupled capacitors configured such that one or more of the parallel coupled capacitors may be effectively removed from such parallel connection.

In one of the simpler present forms, adjustable thin film capacitors are provided with plural parallel connected capacitors coupled to each other by way of fusible links.

Another positive aspect of such present types of devices is that such fusible links coupling the plurality of capacitors in parallel may be "fused" by way of laser irradiation.

In accordance with aspects of certain embodiments of the present subject matter, methodologies are provided to adjust capacitive values of the present adjustable thin film capacitors following manufacture including following mounting on a circuit board.

In accordance with certain aspects of other embodiments of the present subject matter, methodologies have been developed to live-trim (i.e., trim while in operation in a circuit) an adjustable thin film capacitor to very close tolerances. It is to be understood that in the present context, the use of the terminology "close tolerances" does not necessarily mean that an exact target value is known, but instead more broadly encompasses adjusting the capacitor to a relatively finely-tuned value so as to correspondingly provide fine-tuning of an associated live circuit.

In accordance with yet additional aspects of further embodiments of the present subject matter, apparatuses and accompanying methodologies have been developed to provide in-situ laser trimming of ladder array configured capacitors to provide very close tolerances while avoiding rearrangements or reconfiguration of hosting printed circuit boards.

It is to be understood that various aspects of embodiments of the present subject matter relate to apparatuses while other aspects thereof equally relate to either or both of accompanying or corresponding methodologies.

One exemplary present embodiment relates to an adjustable thin film capacitor, adapted for adjusting the resulting capacitance value thereof while such capacitor is in operation in a circuit, comprising respective first and second terminals; and a capacitor array, situated electrically between such respective first and second terminals, such capacitor array comprising a plurality of respectively valued sub-component capacitors, arranged so that respective of such sub-component capacitors may be removed from the resulting capacitance value of such adjustable thin film capacitor.

In certain of the foregoing embodiments, such sub-component capacitors may comprise a base value capacitor and plural parallel coupled capacitors configured such that one or more of the parallel coupled capacitors may be effectively removed from such parallel connection, whereby the resulting capacitance value of such thin film capacitor may be adjusted.

Still further, in certain present embodiments, such plural parallel coupled capacitors may be preferably coupled by way of fusible links, configured in a capacitive laddering effect, so that selected removal of respective such parallel coupled capacitors correspondingly adjusts the resulting capacitance value of such thin film capacitor.

Yet further, such exemplary fusible links for coupling the plurality of capacitors in parallel may be respectively ablated by laser irradiation; and such thin film capacitor may further include a laser radiation transparent passivation layer covering at least such fusible links, whereby such resulting capacitance value of such thin film capacitor may be adjusted while such thin film capacitor is in an intended use environment. Such fusible links preferably are situated such that no electrode of a respective sub-component capacitor lies either above or below a respective fusible link, so that subsequent ablation of any fusible link does not create potential shorts or leakages.

In yet another alternative present exemplary embodiment, an in-situ adjustable thin film capacitor, adapted for post production adjustment of the resulting capacitance value thereof, may comprise respective first and second terminals; and a capacitor array, situated electrically between such respective first and second terminals, such capacitor array comprising a base value capacitor and plural parallel coupled capacitors coupled with at least one of such terminals by way of fusible links, and configured in a capacitive laddering effect, so that selected removal of respective such fusible links correspondingly removes parallel coupled capacitors so as to adjust the resulting capacitance value of such thin film capacitor. In such embodiment, preferably such fusible links are situated such that no electrode of a respective capacitor of such capacitor array lies either above or below a respective fusible link, so that subsequent disruption of electrical connection of any fusible link does not create potential shorts or leakages; and such capacitive laddering configuration preferably includes at least one respective single capacitor of relatively larger capacitive value and a plurality of substantially duplicative capacitors of at least two relatively lower capacitive values. In other present exemplary embodiments of the foregoing exemplary arrangement, such capacitive laddering configuration may include at least two respective single capacitors having capacitive values respectively of at least 1.0 pF; and such plurality of substantially duplicative capacitors may include at least ten of such capacitors having capacitive values of respectively no more than 0.5 pF.

In yet another present exemplary alternative embodiment, a capacitor array may be configured for post production in-situ laser trimmable use, for adjustment of the resulting capacitance value thereof while such capacitor array is in operation in a circuit. In such embodiment, preferably such array may comprise a substrate; a first metallization layer formed on such substrate and having a first portion thereof providing a respective connection portion for a first terminal and providing a plurality of common electrode areas, and having a second portion thereof providing a respective connection portion for a second terminal; a dielectric layer formed on such first metallization layer and having respective first and second windows formed therein and aligned for respective association with such first and second terminal connection portions of such first metallization layer; a second metallization layer formed on such dielectric layer and having respective first and second terminal connection portions thereof aligned with corresponding such portions of such first metallization layer, and having a plurality of second electrode layers for correspondence with selected portions of such common electrode areas of such first metallization layer, and having a respective plurality of fusible links associated respectively with such second electrode layers for fusibly connecting such second electrode layers with a selected one of such first and second terminal connections portions of such second metallization layer; a passivation layer formed over such second metallization layer and having respective first and second windows formed therein and aligned for respective association with such first and second terminal connection portions of such second metallization layer; and termination plating received in such first and second windows of such passivation layer and interconnected with such first metallization layer via such respective windows of such dielectric layer and of such passivation layer, and via such respective first and second terminal connection portions of such second metallization layer. In such exemplary arrangement, preferably such passivation layer is transparent to laser radiation, and such fusible links may be respectively ablated by laser irradiation, whereby the resulting capacitance value of such capacitor array may be adjusted with laser ablation through such passivation layer of selected fusible links while such capacitor array is operative in a circuit, for precise trimming of such capacitor array capacitance value.

It is to be further understood that the present subject matter equally relates to corresponding methodology. For example, one present exemplary embodiment relates to a method of adjusting the resulting capacitance value of a thin film capacitor while such capacitor is in operation in a circuit. Such exemplary method may include providing a capacitor having respective first and second terminals; providing a capacitor array, situated electrically between such respective first and second terminals, such capacitor array comprising a plurality of respectively valued sub-component capacitors, arranged so that respective of such sub-component capacitors may be removed from the resulting capacitance value of such adjustable thin film capacitor; and adjusting the resulting capacitance value of such thin film capacitor by respectively removing therefrom selected of such respectively valued sub-component capacitors.

Alternatives of the foregoing exemplary methodology may further include providing such sub-component capacitors as a base value capacitor and plural parallel coupled capacitors configured such that one or more of the parallel coupled capacitors may be effectively removed from such parallel connection; and such adjusting step includes adjusting the resulting capacitance value of such thin film capacitor by selectively removing one or more of such parallel coupled capacitors from such parallel connection thereof.

In exemplary of such embodiments, such plural parallel coupled capacitors may be coupled by way of fusible links, configured in a capacitive laddering effect; and such adjusting step may include selectively removing respective such parallel coupled capacitors by disrupting their corresponding fusible links, so as to correspondingly adjust the resulting capacitance value of such thin film capacitor.

In certain of the foregoing embodiments, such fusible links provided for coupling the plurality of capacitors in parallel may be respectively ablated by laser irradiation; and such methodology may alternatively further include covering at least such fusible links with a laser radiation transparent passivation layer, whereby such resulting capacitance value of such thin film capacitor may be adjusted via laser trimming of such laser-ablative fusible links while such thin film capacitor is in an intended use environment.

In still further alternatives of the foregoing exemplary methods, such capacitive laddering configuration may include at least two respective single capacitors having capacitive values respectively of at least 1.0 pF; and such plurality of substantially duplicative capacitors may include at least ten of such capacitors having capacitive values of respectively no more than 0.5 pF.

In another present alternative exemplary methodology, the present subject matter may relate to a method of making a capacitor array configured for post production in-situ laser trimmable use, for adjustment of the resulting capacitance value thereof while such capacitor array is in operation in a circuit, such method comprising providing a substrate; forming a first metallization layer on such substrate and having a first portion thereof providing a respective connection portion for a first terminal and providing a plurality of common electrode areas, and having a second portion thereof providing a respective connection portion for a second terminal; forming a dielectric layer on such first metallization layer and having respective first and second windows formed therein and aligned for respective association with such first and second terminal connection portions of such first metallization layer; forming a second metallization layer on such dielectric layer and having respective first and second terminal connection portions thereof aligned with corresponding such portions of such first metallization layer, and having a plurality of second electrode layers for correspondence with selected portions of such common electrode areas of such first metallization layer, and having a respective plurality of fusible links which are respectively ablatable by laser irradiation and associated respectively with such second electrode layers for fusibly connecting such second electrode layers with a selected one of such first and second terminal connections portions of such second metallization layer; forming a laser radiation transparent passivation layer over such second metallization layer and having respective first and second windows formed therein and aligned for respective association with such first and second terminal connection portions of such second metallization layer; and providing termination plating received in such first and second windows of such passivation layer and interconnected with such first metallization layer via such respective windows of such dielectric layer and of such passivation layer, and via such respective first and second terminal connection portions of such second metallization layer; and adjusting the resulting capacitance value of such capacitor array with laser ablation through such passivation layer of selected fusible links while such capacitor array is operative in a circuit, for precise trimming of such capacitor array capacitance value.

In the foregoing alternative exemplary methodology, additional alternatives may be practiced so that such plurality of second electrode layers of such second metallization layer, such corresponding selected portions of such common electrode areas of such first metallization layer, and such dielectric layer situated therebetween, form respectively valued sub-component capacitors, arranged so that respective of such sub-component capacitors may be removed from the resulting capacitance value of such capacitor array upon ablation of its respective fusible link. In yet other alternative embodiments, such sub-component capacitors may comprise a base value capacitor and plural parallel coupled capacitors configured in a capacitive laddering effect, such that one or more of the parallel coupled capacitors may be effectively removed from such parallel connection. Further, such fusible links may be situated such that no electrode of a respective sub-component capacitor lies either above or below a respective fusible link, so that subsequent ablation of any fusible link does not create potential shorts or leakages.

In some alternatives of the foregoing, such capacitive laddering configuration may include at least one respective single capacitor of relatively larger capacitive value and a plurality of substantially duplicative capacitors of at least two relatively lower capacitive values. In other present alternative of the foregoing, such capacitive laddering configuration may include at least two respective single capacitors having capacitive values respectively of at least 1.0 pF; and such plurality of substantially duplicative capacitors may include at least ten of such capacitors having capacitive values of respectively no more than 0.5 pF.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
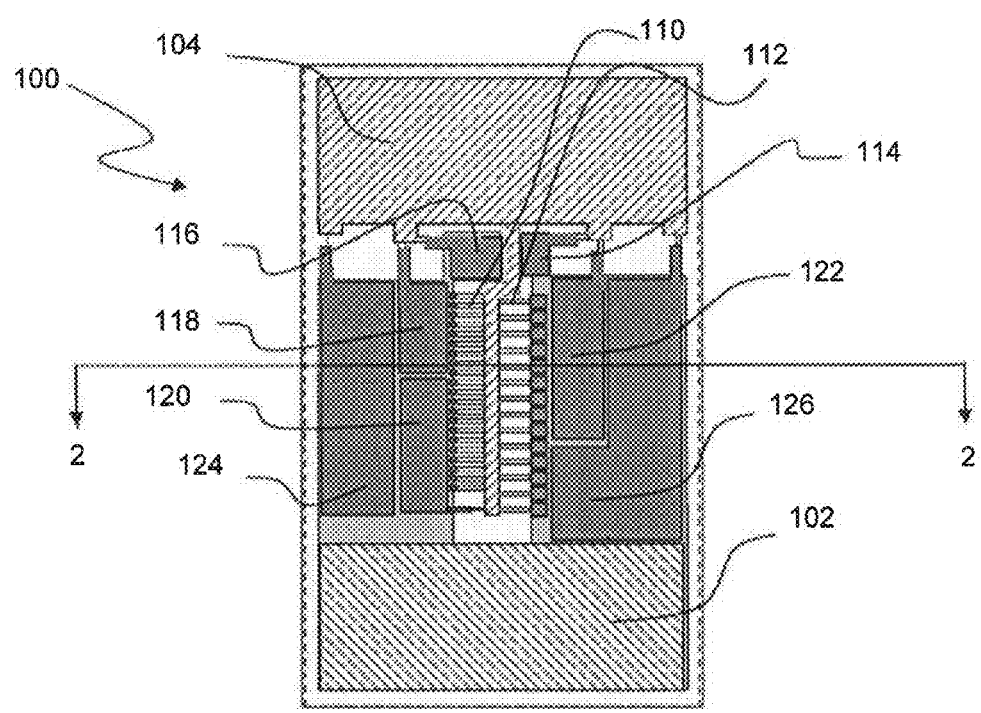
FIG. 1 is a top planar view of an exemplary capacitor array constructed in accordance with the present technology illustrated with a typical passivation layer removed.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with a precision laser adjustable thin film capacitor structures and/or related methodologies.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices, features, or steps not expressly mentioned which perform the same or similar function or functions.

Reference will now be made in detail to various exemplary presently preferred embodiments of the subject precision laser adjustable thin film capacitor. Referring now to the drawings, FIG. 1 illustrates a top planar view of an exemplary precision laser trimmable thin film capacitor array 100 constructed in accordance with the present technology, and illustrated with a typically or normally employed passivation layer removed for clarity of illustration.

As shown in such FIG. 1, present capacitor array 100 includes a first pole or terminal 102 and a second pole or terminal 104 between which a number of variously sized sub-component capacitors are in accordance with present subject matter connected in parallel. The capacitive values of the sub-component capacitors are preferably chosen such that a capacitive laddering effect is achieved. In such manner, several substantially duplicative capacitors of one or more lower capacitive values within the ladder may be provided. At the same time, single capacitors of several relatively larger capacitive values may be included in the capacitor array 100. It is possible, of course, to provide more than one of each of such exemplary higher valued capacitors, and all such options and alternatives are fully contemplated and intended to be included within the scope of the present disclosure.

In an exemplary configuration, a relatively large number of the relatively smaller capacitive valued sub-components may be provided. In the exemplary configuration of FIG. 1, for example, twenty-one first value capacitors 110 may be included in the capacitor array 100. In an exemplary configuration, such first valued capacitors may correspond to a 0.02 pF capacitor. In like manner, a large number of second value capacitors 112 may be provided. In an exemplary embodiment, second value capacitors 112 may correspond to 0.20 pF capacitors and fourteen such capacitors may be provided within capacitor array 100. Of course, alternative capacitive values and numbers of included sub-component capacitors may be employed, as will be fully understood by those of ordinary skill in the art from the complete disclosure herewith.

With further reference to FIG. 1, it will be noticed that larger valued capacitors may be included in capacitor array 100 for example as single entities. For example, third value capacitor 114 may correspond to a 1.0 pF capacitor, fourth value capacitor 116 may correspond to a 2.0 pF capacitor, fifth value capacitor 118 may correspond to a 4 pF capacitor, sixth value capacitor 120 may correspond to a 6 pF capacitor, seventh value capacitor 122 may correspond to a 8 pF capacitor, eighth value capacitor 124 may correspond to a 16 pF capacitor, and ninth value capacitor 126 may correspond to a 24 pF capacitor. It should be appreciated that plural capacitors corresponding to various third through ninth valued capacitors may be provided, and all variations thereto are intended as included within the scope of the present disclosure. For example, ninth value capacitor 126 mentioned above as corresponding to a 24 pF capacitor may be subdivided into two capacitors of 12 pF each. Similar such divisions are possible with other capacitors of the capacitor array 100. Alternatively, selected of the illustrated capacitors may be subdivided in addition to or alternatively to providing plural higher valued subcomponent capacitors.

Further with reference to FIG. 1, it should be noticed and understood that per the present subject matter each of the sub-component capacitors are coupled to terminal 104 by way of a fusible element. In the context of the present disclosure, the term "fusible element" is intended to describe a conductive element whose conductive path may be disrupted or broken by application of energy of such type and of such level so as to either melt or ablate away a portion of the element. Such fusible elements are more clearly seen in FIGS. 4a and 4b, as will be described in greater detail hereinbelow. One present point of interest here, however, is the relative position of the fusible elements (which will also be more thoroughly described below). It should be noted, however, that each of the fusible elements is located such that, for example, laser ablation of the fusible elements does not compromise any portion of the subcomponent capacitors. Such is made possible per the present technology by locating the fusible elements so that no portion of the respective subcomponent's opposite electrode lie either above or below the respective fusible elements, so that subsequent ablation does not create potential shorts or leakage zones.

Figure 2:
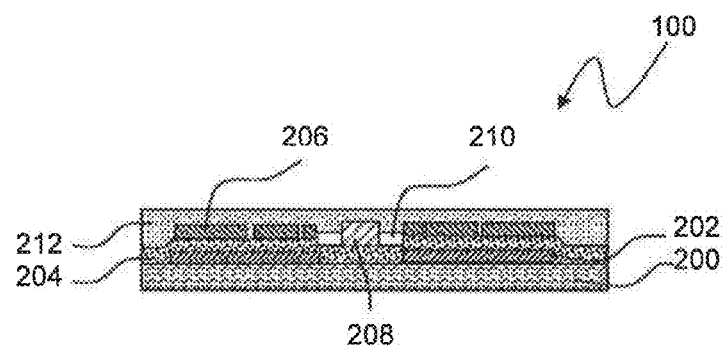
FIG. 2 is a cross-section of the exemplary capacitor array of FIG. 1, taken alone line 2-2 thereof.

With reference now to FIG. 2, there is illustrated a cross-section of capacitor array 100 taken along section line 2-2 of FIG. 1. As may be observed from FIG. 2, exemplary capacitor array 100 may be constructed in layered fashion, which is more fully described hereinbelow with reference to FIGS. 3a through 3e. Preliminarily, however, it will be seen that such exemplary capacitor 100 is formed preferably starting with a substrate 200, over which is formed a representative first capacitor electrode 202. Such exemplary first capacitor electrode 202 may be covered with a dielectric layer 204, over which is formed a representative second capacitor electrode 206, a conductor 208, and a representative fusible link 210. The relationships of capacitor electrode 206, conductor 208, and fusible link 210 will be more fully described with reference to FIGS. 4a and 4b hereinbelow. Finally, per present subject matter, a passivation layer 212 covers the top portion of capacitor array 100, including capacitor electrode 206, conductor 208, fusible link 210 and otherwise exposed areas of dielectric material 204.

With reference to FIGS. 3a through 3e, there are representatively illustrated respective, sequential steps for construction of an exemplary capacitor array in accordance with the present technology. As may be seen in such FIG. 3a, a substrate 200 is provided on which is preferably formed a first metallization layer 300. Metallization layer 300 is generally formed as two portions, including a designated first portion 302. Such designated first portion 302 is generally U-shaped and corresponds in part to a connection portion 306 for first terminal 102 (FIG. 1) and common electrode areas 308a, 308b, 308c, 308d for the subcomponent capacitors. The designated second portion 304 of metallization layer 300 corresponds to a connection portion for second terminal 104 (FIG. 1).

Figure 3A:
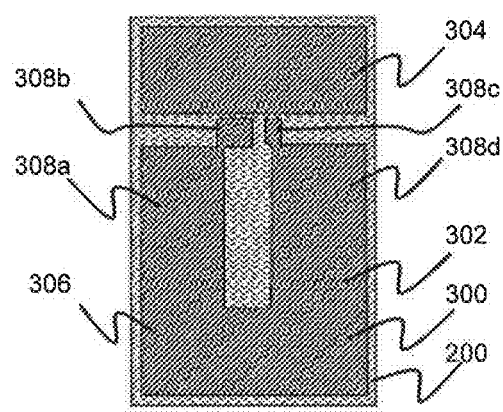
FIGS. 3a through 3e illustrate respective, sequential steps for construction of an exemplary capacitor array in accordance with exemplary methodology of the present technology.
Figure 3B:
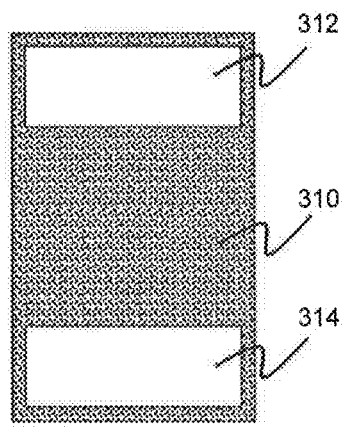

FIG. 3b illustrates placement of a present exemplary dielectric layer 310 over representative metallization layer 300 of FIG. 3a. Windows 312, 314 are provided in dielectric layer 300 for subsequent termination of an exemplary completed capacitor array.

Figure 3C:
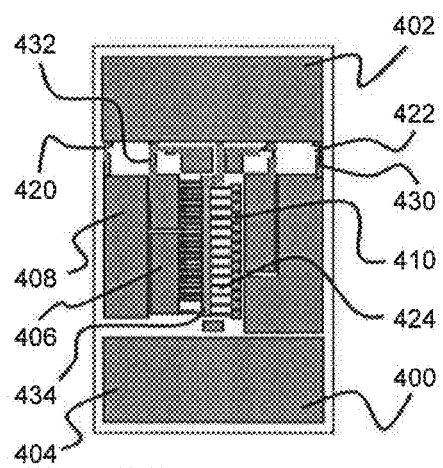

FIG. 3c illustrates placement of an exemplary second metallization layer 400 over dielectric layer 310 (FIG. 3b). Second metallization layer 400 corresponds to further termination layers 402, 404; representative second electrode layers 406, 408, 410; representative fusible (or ablatable) links 420, 422, 424; and representative connecting conductors 430, 432, 434. As previously discussed, each of the individually provided subcomponent capacitors of capacitor array 100 (FIGS. 1, 2, and 41) have an electrode portion, representatively illustrated at 406, 408, 410, coupled by way of fusible (or ablatable) links, representatively illustrated at 420, 422, 424, to a terminal of capacitor array 100 (FIGS. 1, 2, and 41), as represented by metallization portions 304, 402 and exemplary copper termination plating 450 (see also present FIG. 4e).

Figure 3D:
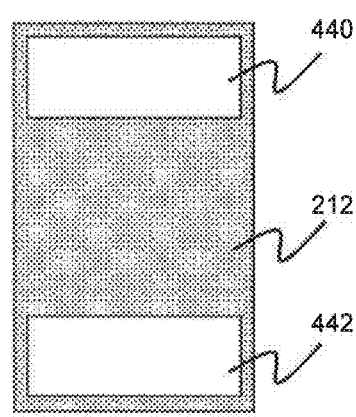

FIG. 3d illustrates placement of previously mentioned exemplary passivation layer 212 (see also FIG. 2) over exemplary second metallization layer 400. Windows 440, 442 are provided as examples for permitting contact with first metallization layer 300 by way of portions 402, 404 of second metallization layer 400 and windows 312, 314.

Figure 3E:
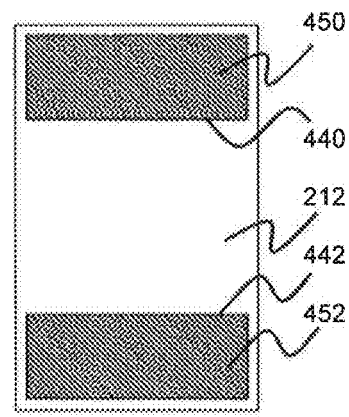

Finally, exemplary FIG. 3e illustrates copper (Cu) termination plating 450, 452 though windows 440, 442 of exemplary passivation layer 212 of the exemplary completed capacitor array.

Figure 4A:
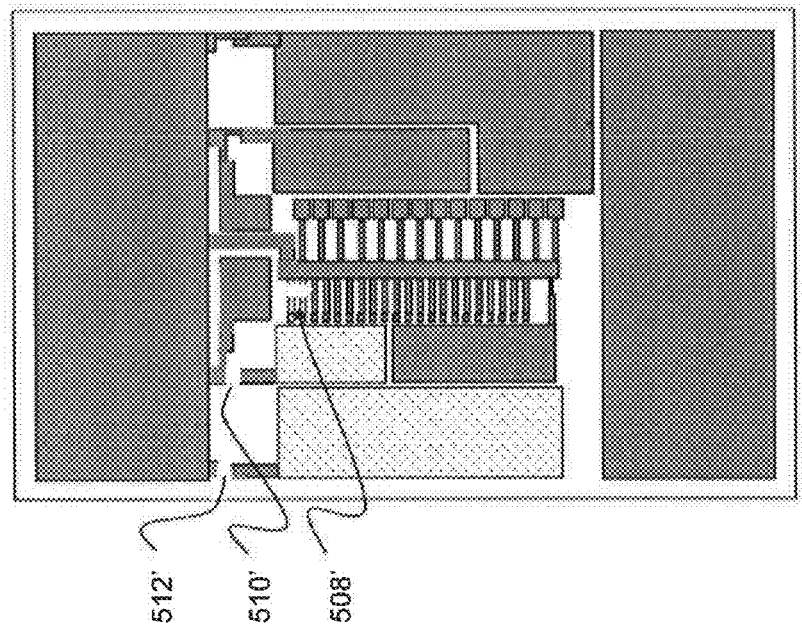
FIG. 4a illustrates an exemplary completed capacitor array but with the passivation layer omitted for clarity of the present view, constructed in accordance with the present technology, and providing an exemplary initial capacitance value of 61 pF.

With reference to FIG. 4a, there is illustrated an exemplary completed capacitor array 100 but with the passivation layer omitted for clarity. Otherwise, such exemplary array 100 is constructed in accordance with the present technology, and so as to provide an exemplary initial capacitance value of 61 pF. FIG. 4a is substantially identical to FIGS. 1 and 3c, the descriptions of which may be further reviewed for additional reference character descriptions. With specific reference to FIG. 4a, it will be noticed that an exemplary capacitor array 100 has been illustrated wherein all of the fusible (or ablatable) links, representatively illustrated at 502, 594, 596, 508, 510 and 512, remain intact. Under such condition, exemplary capacitor array 100 as presently representatively illustrated, may provide an initial capacitive value of 61 pF. It should be appreciated, of course, that capacitor array 100 may be configured as understood by those of ordinary skill in the art, so as to provide virtually any initial capacitive value, as desired by either a manufacturer or user. Thus, the present exemplary specific initial capacitive value is not to be considered in any way as a limitation of the present subject matter.

Figure 4B:
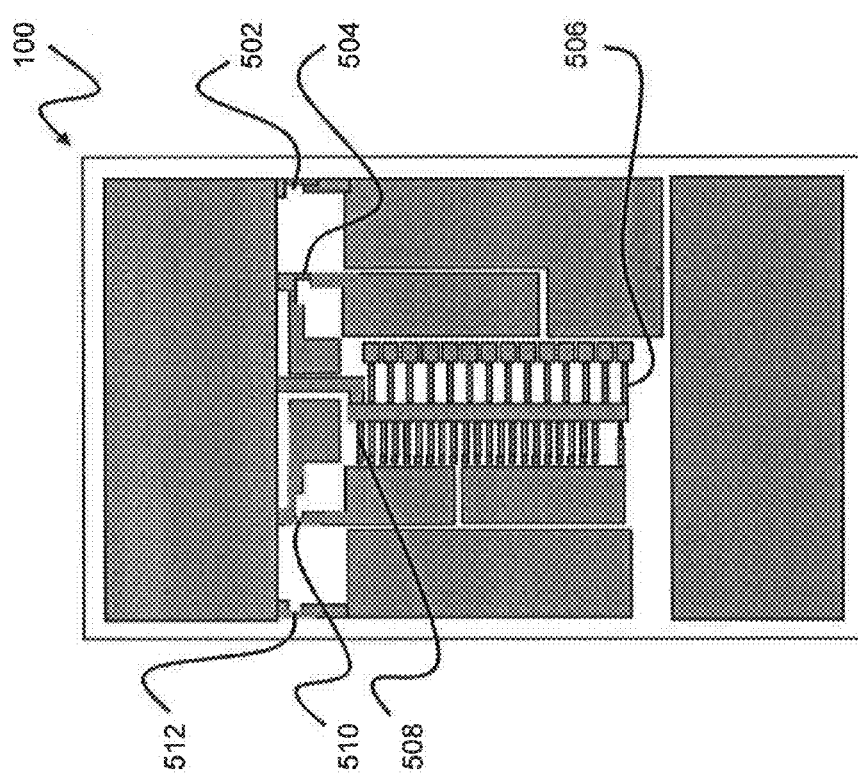
FIG. 4b illustrates a capacitor array corresponding to the array of FIG. 4a following laser trimming per present methodology to reduce the capacitance value thereof for example to 40.96 pF.

With reference now to FIG. 4b, it will be observed and understood per the present subject matter that fusible (or ablatable) links previously in areas 510', 512' and 508' have been removed by laser trimming (e.g., ablation) so that the capacitance value of capacitive array 100 has been reduced by electrically removing or disconnecting several of the previously parallel connected subcomponent capacitors from the exemplary capacitive array 100. With brief reference back to the description of FIG. 1, it will be remembered that the subcomponent capacitor now disconnected from the array by trimming of the fusible link at 510' was, in the example given, assigned a capacitive value of 16 pF. Similarly, the subcomponent capacitor now electrically removed by ablation of the fusible link at 512' was exemplarily designated as a 4 pF capacitor. Further, with respect to the subcomponent capacitors now removed by ablation of two fusible links in the area at 508', such capacitors were exemplarily designated as 0.02 pF capacitors. Thus, in the present exemplary configuration of the present subject matter, and starting with an initial capacitive value of 61 pF, the trimmed capacitive value per present practices, corresponds to 61 pF minus 16 pF minus 4 pF minus 2(0.02 pF)=40.96 pF.

A significant feature of the present subject matter resides in the provision of a capacitive array that may be trimmed in-situ under live operating conditions. Thus, a laser radiation transparent passivation layer may advantageously be applied to permit trimming even after placement of the array in a host environment. In such context, the trimming of a capacitor in-vivo (or in-situ) may in some instances not be for the purpose of adjusting such component to a specific, previously known target value, but for the purpose of adjusting it so as to optimize the associated circuit performance. For example, a precise value may be not be known or even of concern, but even with the buildup of other parasitics in the circuit, the system can be fine-tuned by altering this one component. In one exemplary present embodiment, a customer or user may, for example, install the capacitor with an intentionally high value, then monitor the frequency of the circuit, and cut out capacitance until the exact frequency is generated.

While the present subject matter has been described in detail with respect to specific embodiments thereof, it will be appreciated that those skilled in the art, upon attaining an understanding of the foregoing and the referenced figures, may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method of making a capacitor array configured for post production in-situ laser trimmable use, for adjustment of the resulting capacitance value thereof while such capacitor array is in operation in a circuit, such method comprising:
    providing a substrate;
    forming a first metallization layer on the substrate and having a first portion thereof providing a respective connection portion for a first terminal and providing a plurality of common electrode areas, and having a second portion thereof providing a respective connection portion for a second terminal;
    forming a dielectric layer on the first metallization layer and having respective first and second windows formed therein and aligned for respective association with such first and second terminal connection portions of the such first metallization layer;
    forming a second metallization layer on such dielectric layer and having respective first and second terminal connection portions thereof aligned with corresponding such portions of the first metallization layer, and having a plurality of second electrode layers for correspondence with selected portions of such common electrode areas of the first metallization layer, and having a respective plurality of fusible links which are respectively ablatable by laser irradiation and associated respectively with such second electrode layers for fusibly connecting such second electrode layers with a selected one of such first and second terminal connections portions of the second metallization layer;
    forming a laser radiation transparent passivation layer over the second metallization layer and having respective first and second windows formed therein and aligned for respective association with such first and second terminal connection portions of the second metallization layer; and
    providing termination plating received in such first and second windows of such passivation layer and interconnected with the first metallization layer via such respective windows of such dielectric layer and of such passivation layer, and via such respective first and second terminal connection portions of the second metallization layer; and
    adjusting the resulting capacitance value of such capacitor array with laser ablation through such passivation layer of selected fusible links while such capacitor array is operative in a circuit, for precise trimming of such capacitor array capacitance value.

2. The method as in claim 1, wherein such termination plating comprises copper.

3. The method as in claim 1, wherein such plurality of second electrode layers of the second metallization layer, such corresponding selected portions of such common electrode areas of the first metallization layer, and such dielectric layer situated therebetween, form respectively valued sub-component capacitors, arranged so that respective of such sub-component capacitors may be removed from the resulting capacitance value of such capacitor array upon ablation of its respective fusible link.

4. The method as in claim 3, wherein such sub-component capacitors comprise a base value capacitor and plural parallel coupled capacitors configured in a capacitive laddering effect, such that one or more of the parallel coupled capacitors may be effectively removed from such parallel connection.

5. The method as in claim 4, wherein such capacitive laddering configuration includes at least one respective single capacitor of relatively larger capacitive value and a plurality of substantially duplicative capacitors of at least two relatively lower capacitive values.

6. The method as in claim 4, wherein:
    such capacitive laddering configuration includes at least two respective single capacitors having capacitive values respectively of at least 1.0 pF; and
    such plurality of substantially duplicative capacitors includes at least ten of such capacitors having capacitive values of respectively no more than 0.5 pF.

7. The method as in claim 3, wherein such fusible links are situated such that no electrode of a respective sub-component capacitor lies either above or below a respective fusible link, so that subsequent ablation of any fusible link does not create potential shorts or leakages.

* * * * *